United States Patent [19]
Tang et al.

[11] Patent Number: 5,831,901
[45] Date of Patent: Nov. 3, 1998

[54] METHOD OF PROGRAMMING A MEMORY CELL TO CONTAIN MULTIPLE VALUES

[75] Inventors: Yuan Tang, San Jose; Qimeng Zhou, Santa Clara; Hsingya Arthur Wang, Saratoga, all of Calif.

[73] Assignee: Advanced Micro Devices, Inc., Sunnyvale, Calif.

[21] Appl. No.: 745,596

[22] Filed: Nov. 8, 1996

[51] Int. Cl.[6] .................................................. G11C 11/34
[52] U.S. Cl. ................................ 365/185.03; 365/185.26
[58] Field of Search ........................... 365/185.03, 185.26

[56] References Cited

U.S. PATENT DOCUMENTS

| | | | |
|---|---|---|---|
| 5,095,344 | 3/1992 | Harari | 365/185.03 |
| 5,272,669 | 12/1993 | Samachisa et al. | 365/185.03 |
| 5,418,743 | 5/1995 | Tomioka et al. | 365/185.03 |
| 5,487,033 | 1/1996 | Keeney et al. | 365/185.03 |
| 5,617,357 | 4/1997 | Haddad et al. | 365/185.18 |

OTHER PUBLICATIONS

"Intel working on multilevel flash," Electronic Engineering Times, Aug. 1, 1994, Issue 808.

*Primary Examiner*—David C. Nelms
*Assistant Examiner*—Michael T. Tran
*Attorney, Agent, or Firm*—Fliesler, Dubb, Meyer & Lovejoy LLP

[57] ABSTRACT

A method for programming multiple values in an individual flash memory cell is disclosed. An individual flash cell is programmed by holding the bit line, corresponding to the particular memory cell to a value, $V_d$, while the voltage on the control gate, $V_g$, of the memory cell is varied. By varying the voltage on the control gate, multiple values are stored in the memory cell. The resulting values are self-convergent, therefore, verify circuitry becomes unnecessary.

8 Claims, 2 Drawing Sheets

METHOD OF PROGRAMMING A MEMORY CELL TO CONTAIN MULTIPLE VALUES

FIELD OF THE INVENTION

This invention relates to flash memory cells, and more particularly, to an improved method of programming flash EEPROM memory cells.

BACKGROUND OF THE INVENTION

There is a class of non-volatile memory devices known as flash electrically erasable and programmable read only memory devices (EEPROM). The term "flash" refers to the EEPROMs having data written to or programmed, by a process known as hot electron injection and being erased by Fowler-Nordheim (FN) tunnelling.

Flash EEPROM memory cells may be formed on a semiconductor substrate having diffused therein a n+drain region, a n-type source region and a channel region positioned between the drain and source regions. A tunnel oxide is formed on the silicon substrate separating a floating gate from the source and drain regions. A control gate is separated from the floating gate by another insulating layer.

According to conventional operation, flash memory cells are programmed by inducing hot electron injection of electrons from the channel region near the drain region to the floating gate. Electron injection will carry a negative charge onto the floating gate. This injection mechanism is normally induced by grounding the source region, applying a relatively high positive voltage (approximately 12V) to the control gate and applying a moderate voltage (approximately 5V) to the drain region in order to generate high energy (hot) electrons.

Erasing flash EEPROM memory cells is typically carried out by Fowler-Nordheim tunnelling between the floating gate and the source (known as source erase or negative gate erase) or between the floating gate and the substrate (known as channel erase).

A drawback associated with conventional flash memory cells is that, in an array of flash EEPROM memory cells, the write operation is performed one byte at a time while erasing of the memory cells is performed in a sector by sector fashion within the array. For example, in order to change one byte of data, each cell in the memory array has to be first programmed (or "charged"), representing a "0" value, then erased (or "discharged"), representing a "1" value, and finally the new byte of data is written to the particular location, with the memory cells whose contents that have not been changed being re-written to their previous values.

Another drawback associated with conventional flash memory devices is that a particular flash cell can only store one bit of information, either a "1" or "0". In the programmed state, also known as "charging", the floating gate of a memory cell contains a net negative charge due to the presence of electrons injected from the drain area. For n-channel devices, when the cell is in the programmed state, the electrons on the floating gate keep the n-channel transistor in the logical off "0" state. In the erased state, also known as "discharging," there are no electrons present on the floating gate. When the memory cell is erased, the N-channel transistor is in the logical on "1" state.

Attempts have been undertaken to store multiple values within a single flash memory cell. One such approach is to divide the flash cell into four segments, or layers. A first voltage is applied to divide the flash cell into two high and then, two lower layers. A second voltage is then applied to more accurately place a bit of data into one of the four layers. A verification step is then performed to ensure the accuracy of bit placement. These steps are repeated each time a bit of data needs to be stored in a particular segment of the memory cell.

A drawback associated with such a programming method is that verify circuitry is needed to check whether a particular cell has been properly programmed after each respective bit of data has been placed in a particular flash cell segment. The verify circuitry needed for this operation takes up valuable space on the semiconductor die. Moreover, a substantial portion of the time needed to program a particular memory cell is taken up by the operation of the verify circuitry.

A consequential drawback associated with conventional programming methods is the speed with which data is written to the memory cells. For example, charging one byte of memory through conventional programming methods requires 3 $\mu$sec. The time required for discharging the same one byte of memory (the time needed for electrons on the floating gate to tunnel through the gate oxide) is 0.5 sec. With a memory array having 64K bytes (512K bits), between 700 msec–900 msec is required to change as little as one byte of memory. This process must be performed each time an individual byte of memory has to be changed.

As the trend to fabricate memory devices having high density continues, the ability of individual memory cells of an array to store multiple bits of information and to be able to change the data stored within a particular memory cell without reprogramming the entire array becomes of increasing importance to designers and manufacturers alike.

SUMMARY OF THE INVENTION

The present invention solves the aforementioned and related problems associated with conventional flash memory devices and the methods of programming the same. In the preferred method of the present invention, a flash memory cell is programmed to contain multiple bits of information by applying a first voltage, $V_d$, to the drain of the memory cell; applying a plurality of non-zero voltages, $V_g$, to the respective gate of the memory cell; and by floating the source of the memory cell with the substrate being held at ground potential. Also, according to the preferred method of the present invention, the programming of an entire page of memory is accomplished by applying a first voltage, $V_d$, to a selected bit line of a page; applying a second voltage, $V_g$, to each wordline along the selected bit line while floating the sources of the memory cells along the selected bit line and grounding the substrate.

An advantage of the present invention is that less physical space is needed on a chip for manufacturing a memory array because verify circuitry is not needed.

Another advantage of the present invention is that the memory cell programming time is reduced in that it is no longer necessary to verify the content of the memory cell after programming.

A further advantage of the present invention is the ability to program individual memory cells to store more than one value; hence, improving memory density.

A feature of the present invention is that the layout of the memory cell and the fabrication process for producing the memory cell can be performed in a conventional manner.

BRIEF DESCRIPTION OF THE DRAWINGS

These and other advantages and features of the present invention will become apparent from the following description of the preferred embodiments, taken in conjunction with the accompanying drawings, where like numerals represent like elements, in which.

DETAILED DESCRIPTION

The present invention provides an improved method of programming a flash EEPROM memory cell to contain multiple bits of information. The present invention comprises a programming method where individual cells of a memory array can be programmed to contain multiple bits of information as opposed to conventional programming methods where a particular cell only holds one bit of information.

Figure 1:
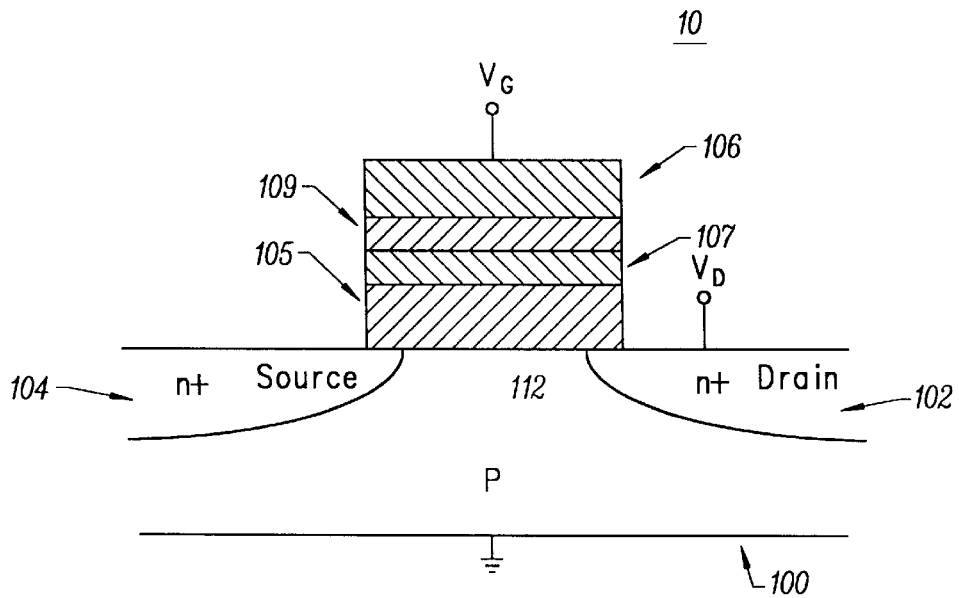
FIG. 1 illustrates a memory cell structure according to the present invention.

FIG. 1 illustrates a poly-II type metal oxide field effect transistor memory cell according to the present invention. The memory cell is fabricated on a P-type semiconductor substrate 100, having diffused therein a drain region 102 heavily doped with arsenic and a heavily doped n+ source region 104. A tunnel oxide region 105, separates the heavily doped source and drain regions 102, 104, respectively from a floating gate 107. A control gate 106 is separated from the floating gate 107 by an insulating layer 109. Although the present description is directed to a device fabricated on a p-type semiconductor substrate, it would be readily apparent to one of ordinary skilled in the art that an n-type semiconductor material can be used to fabricate the substrate. Further, impurities other than arsenic may be used to dope the source and drain regions of the MOSFET 10.

Figure 2:
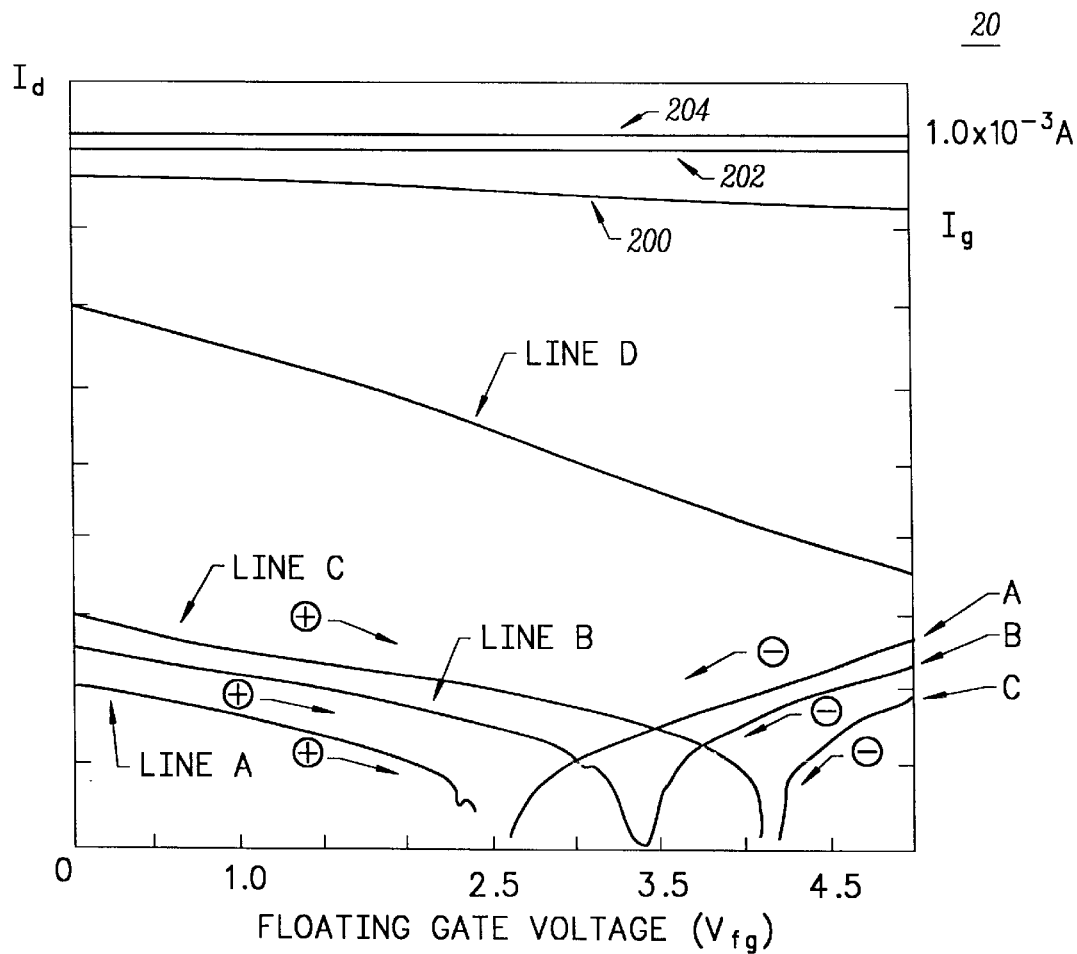
FIG. 2 is a chart showing the convergent characteristics of threshold voltages according to the method of present invention.

As discussed above, flash memory cells are conventionally programmed by applying a particular voltage, $V_g$, to the control gate 106 of the MOSFET 10 while at the same time applying a particular voltage, $V_d$, to the drain region 102 of MOSFET 10 while floating the source region 104 and grounding the substrate 100. By applying a particular voltage to the source and drain regions of the memory cell, electrons or holes from the channel region 112 near the drain region 102 are injected onto the floating gate 107, thereby changing the threshold voltage ($V_t$) of the memory cell 10. The threshold voltage, $V_t$, represents the stored value of the memory cell. Electron (negative charge) injection onto the floating gate from the substrate will increase $V_t$. Hole (positive charge) injection onto the floating gate will decrease $V_t$. A thorough recitation of the principles and effects of electron and hole movement can be found in Tang, et al. *Differentiating Impacts of Hole Trapping vs. Interface States on TDDB Reduction in Thin Oxide Gated Diode Structures*, IEEE/IRPS 1993 and is incorporated herein. FIG. 2 illustrates this relationship in more detail.

FIG. 2 shows a plot of drain current, $I_d$, and floating gate current, $|I_g|$, versus floating gate potential, $V_{fg}$, for the memory cell 10 with fixed values of drain voltages, $V_d$. Line A represents $V_d$=8V; Line B represents $V_d$=9V; and Line C represents $V_d$=10V with the substrate at ground potential and the source floating. As shown in FIG. 2, for a fixed drain voltage $V_d$=7V, represented by Line D, the drain junction is not in the breakdown region, with a measured drain current, $I_d$, below 1 μA and a gate current, $I_g$, below 1 pA.

When a fixed voltage, $V_d$=8V, (Line A) is applied to the drain 102 of the memory cell 10, the threshold voltage, $V_t$, of the memory cell 10 converges to a value of about 2.5V. When the floating gate potential is greater than about 2.5V, electron injection will occur, ($I_g$<0), and the injected electrons will lower the floating gate potential, $V_{fg}$, to approach the convergent voltage, $V_{cvg}$, of 2.5V. When $V_{fg}$ is less than about 2.5V, hole injection occurs which increases $V_{fg}$ to approach the convergent voltage, $V_{cvg}$, of about 2.5V. Therefore, carrier injection will always converge $V_{fg}$ to about 2.5V when $V_d$=8$_v$ it is applied to the drain region with the source floating.

For the memory cell illustrated in FIG. 1, when the substrate is grounded, the voltage present on the floating gate can be written as:

$$V_{fg}=GC \cdot V_g + SC \cdot V_s + DC \cdot V_d + Q/C_{total} \qquad (1)$$

which represents the floating gate potential (voltage), $V_{fg}$, as a function of the charge present on the control gate as well as the charge present on the source terminal and drain terminal. In equation (1), GC represents gate coupling and has the value of $C_1/C_{total}$; SC represents source coupling, having a value of $C_2/C_{total}$; DC represents drain coupling, having a value of $C_3/C_{total}$; $C_1$ represents the capacitance between the floating gate and the control gate; $C_2$ represents the capacitance between the floating gate and the source; and $C_3$ represents the capacitance between the floating gate and the drain. $V_g$, $V_s$, and $V_d$ represents the applied voltages on the control gate, source and drain, respetively; Q represents the charge on the floating gate, and $C_{total}$ represents a total capacitance of the memory cell, defined as $C_1+C_2+C_3$.

When the memory cell is initially erased, Q=0. The cell is then turned on when UV_$V_t$ (a constant value) is applied to the control gate and the floating gate 107 voltage is $V_{fg}$= UV_$V_t$·GC. When there is a charge, Q, already on the floating gate 107, in order to turn on the memory cell, a voltage $V_t$ has to be applied to the control gate 106, so the voltage on the floating gate 107 is represented by $$V_{fg} = V_t \cdot GC + \frac{Q}{C_{total}} = UV\_V_t \cdot GC;$$

thus, $$\frac{Q}{C_{total}}$$

can be represented by:

$$Q/C_{total}=-(V_t-UV\_V_t) \cdot GC \qquad (2)$$

Substituting equation 2 into equation 1, yields:

$$V_{fg}=GC \cdot V_g + DC \cdot V_d - (V_t(t0)-UV\_V_t) \cdot GC \qquad (3)$$

Thus, for a flash cell with an initial threshold voltage $V_t(t0)$, $V_t$ at time t0, the voltage present on the floating gate during programming can be written as shown above in equation 3. Whether electrons or holes will be introduced onto the floating gate depends upon whether the voltage present on the floating gate, $V_{fg}$ is larger or smaller than the convergent voltage, $V_{cvg}$, as shown in FIG. 2.

At a subsequent time, t1>t0, the voltage on the floating gate reaches the convergence voltage, $V_{cvg}$, due to charge accumulation by either electron or hole injection, as described by equation 4 below:

$$V_{fg}=GC \cdot V_g+DC \cdot V_d-(V_t(t1)-UV\_V_t) \cdot GC=V_{cvg} \qquad (4)$$

Since a convergent voltage, $V_{cvg}$, is known for the memory cell shown in FIG. 1, the applied voltage at the control gate, $V_g$, can be obtained as a function of the desired threshold voltage, $V_t(t1)$ from equation (4):

$$GC \cdot V_g=V_{cvg}-DC \cdot V_d+(V_t(t1)-UV\_V_t) \cdot GC \qquad (5)$$

Equation (5) indicates that for any desired threshold value (representing one bit of information), $V_t$, at convergent time t1, i.e., $V_t(t1)$, there is a corresponding unique control gate voltage, $V_g$. Thus, after a period of time (t1–t0) of applying a voltage, $V_g$, to the control gate 106, the threshold voltage, $V_t$, of the memory cell 10 will change to $V_t(t1)$ regardless of the threshold voltage, $V_t$, present on the floating gate at time t0.

Accordingly, as shown above with respect to equations 1–5 and illustrated in FIG. 2, a flash memory cell may be programmed to store a set of different values of $V_t$ by applying a particular fixed voltage, $V_d$, to the drain of the memory cell and by applying a set of different voltages, $V_g$, each corresponding to the value to be stored, to the gate of the memory cell. Each voltage, $V_g$, applied to the gate of the memory cell corresponds to a particular threshold voltage, $V_t$, and hence a particular value of data stored in the cell. In one method of the present invention, four values (2 bits) can be stored in each memory cell. However, in an alternative embodiment, storage of more than two bits (i.e., 4, 8, 16, etc.) is possible by using the method of the present invention. The resulting threshold voltages are self-convergent; thus, verify circuitry is not needed. Because verify circuitry is not necessary, the time used to verify that the memory cell has been programmed is also not necessary; thereby, greatly reducing programming time. Also, because verify circuitry is not needed, valuable space is made available for the introduction of more memory cells, or to permit the further reduction of the area taken up by the memory cells.

Figure 3:
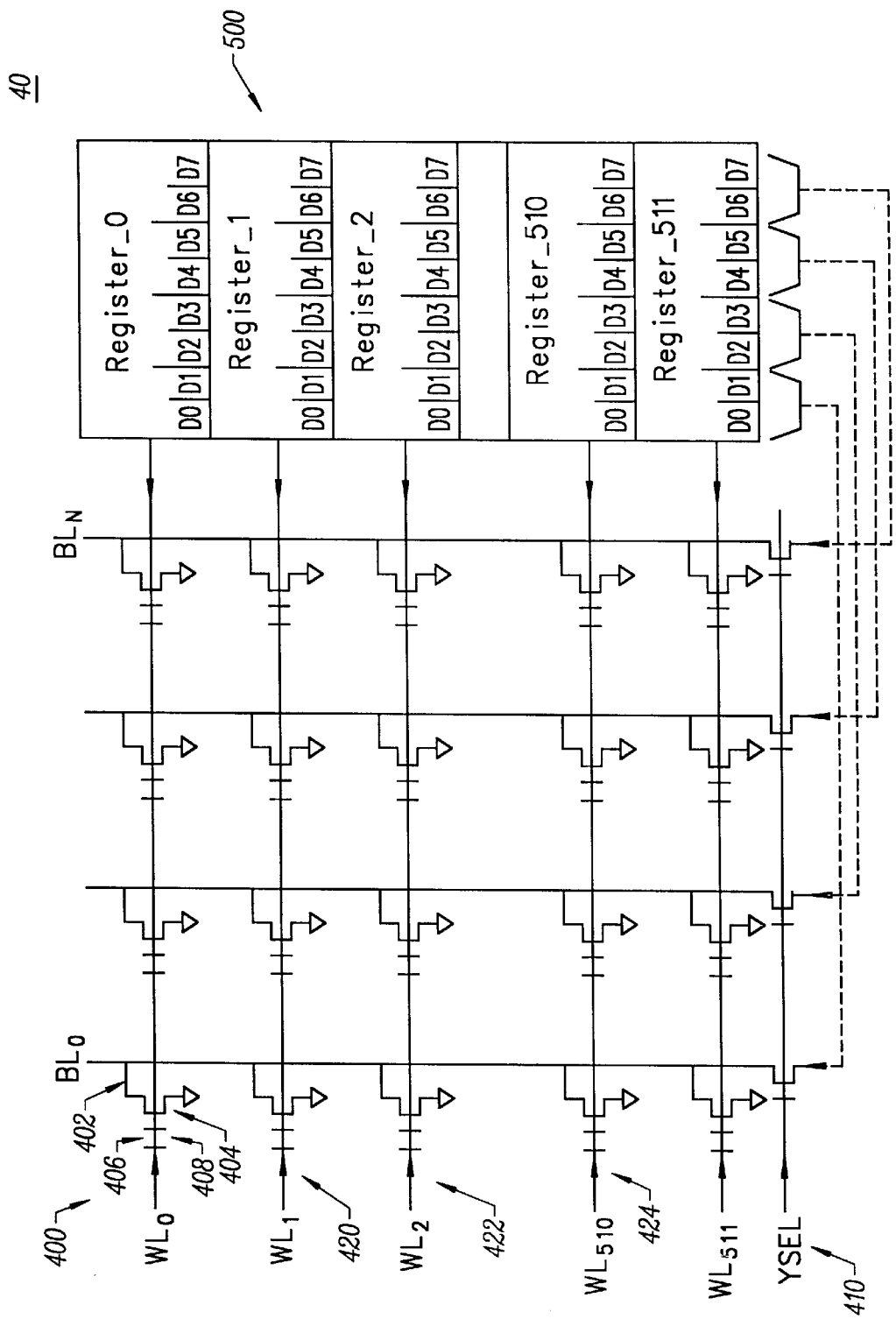
FIG. 3 is a schematic diagram representing an architecture for performing page mode programming of a memory array according to the method of the present invention.

FIG. 3 illustrates a memory array structure used in performing page mode programming according to one method of the present invention. FIG. 3 shows a memory array 40 containing 512 wordlines ($WL_0$–$WL_{511}$) and 512 registers (Register _0–Register _511). Each register contains one byte (eight bits) of information, with 512 bytes constituting one page of memory. In one embodiment of the method of the present invention, the contents of the memory array are altered one bit line at a time.

According to one embodiment of the present invention, in order to program 512 memory cells on the same bit line, i.e., ($BL_0$), the bit line ($BL_0$) is selected by applying a fixed voltage (8V) to the bit line. The unselected bit lines ($BL_1$–$BL_{511}$) are kept at ground potential. The values to be programmed into each memory cell on the selected bit line ($BL_0$) is determined by the corresponding value stored in the first two bits (D0, D1) of the respective register. There are four possible combinations (00, 01, 10, 11) for the values of D0 and D1. Thus, each combination results in a specific voltage ($V_g$) being applied to all the wordlines. For example, the values to be written to the memory cells along $BL_0$ are stored in the first two digits (D0, D1) of the corresponding Register.

As discussed above, by using the method of the present invention, a memory cell can store two binary values based upon the voltage, $V_g$, applied to the control gate 408 via $WL_0$. Because each memory cell can be programmed to have four values, two binary digits are needed to represent the four values. Particularly, for the first memory cell 400 along $BL_0$, the voltage, $V_g$, to be applied to the gate 408 along $WL_0$ is determined by the values of D0 and D1 stored in Register_0. In Register_0, D2 and D3 are used to determine the voltage applied to $WL_0$ when $BL_1$ is selected. Likewise, D4 and D5, in Register _0, are used to determine the voltage applied to $WL_0$ when $BL_2$ is selected. Also, D6 and D7, in Register_0, are used to determine the voltage applied to $WL_0$ when $BL_3$ is selected. As such, one (1) byte of information in a register can be programmed into four cells in the memory array 40. For comparison, eight cells are required to store the same one byte of information using conventional programming methods.

During programming, the $V_g$ determined by the corresponding two digits in each corresponding register within buffer 500 is applied to each wordline simultaneously so that for any selected bitline, any control gate has a predetermined voltage applied to it thereby simultaneously programming the memory cells along a single bitline. This method can be used to write data to memory locations for every four bitlines, $BL_4$–$BL_7$, $BL_8$–$BL_{15}$, etc.

The foregoing description of the invention has been presented for purposes of illustration and description. It is not intended to be exhaustive or to limit the invention to the precise form disclosed, and obviously, modification and variation of the invention are possible in light of the above teaching. A method of programing a memory cell to have multiple values was chosen and described in order to best explain the principals of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method of programming a cell having a drain, a control gate, and a source positioned on a substrate with multiple data values, comprising the steps of:

applying a voltage, $v_d$, to said drain during the programming of a predetermined first data value of said cell;

applying a predetermined voltage, $v_g$, to said control gate of said cell, responsive to said predetermined first data value, during the programming of said cell;

holding said substrate at ground potential; and floating said source.

2. The method of claim 1, wherein said voltage $v_d$, has the value of approximately 8v.

3. The method of claim 1, wherein said voltage $v_g$, has a value in the range of approximately 8v to approximately 10v.

4. In a flash memory cell having a source, a control gate coupled to a respective word line and a drain coupled to a respective bit line, a method of programming said flash memory cell comprising the steps of:

applying a first voltage $v_d$, to said respective bit line during the programming of a predetermined first data value;

applying a second voltage, $v_g$, to said respective word line, responsive to said predetermined first data value, during the programming of said cell;

floating said source;

applying a third voltage, $v_g$, to said respective word line, responsive to a predetermined second data value; and holding a substrate at ground potential.

5. The method of claim 4, wherein said voltage $v_d$ has the value of approximately 8v.

6. The method of claim 4, wherein said voltage $v_g$ has a plurality of values.

7. The method of claim 6, wherein said voltage $v_g$ has a value in the range of approximately 8v to approximately 10v.

8. In an array of memory cells formed on a substrate, a plurality of memory cells having a source, a drain and a gate, wherein a plurality of bit lines are connected to said respective plurality of drains, and wherein a plurality of word lines are connected to said respective plurality of gates, comprising the steps of:

applying a voltage, $v_d$, to a first bit line in said plurality of bit lines;

applying simultaneously a respective plurality of voltages, $v_g$, to said plurality of word lines, responsive to a respective plurality of data values;

floating said respective sources; and holding said substrate at ground potential.

\* \* \* \* \*

UNITED STATES PATENT AND TRADEMARK OFFICE
CERTIFICATE OF CORRECTION

PATENT NO.   : 5,831,901
DATED        : November 3, 1998
INVENTOR(S)  : Yuan Tang et al.

It is certified that error appears in the above-identified patent and that said Letters Patent is hereby corrected as shown below:

Column 3, line 23,   "memory cell" should be -- (MOSFET) memory cell 10 --;

Column 3, line 24,   "memory cell" should be -- (MOSFET) memory cell 10 --;

Column 4, line 29,   "respetively" should be -- respectively -.

Signed and Sealed this

Twenty-fifth Day of May, 1999

Attest:

Q. TODD DICKINSON

Attesting Officer       Acting Commissioner of Patents and Trademarks